United States Patent [19]

Armstrong

[11] 3,853,633

[45] Dec. 10, 1974

[54] METHOD OF MAKING A SEMI PLANAR INSULATED GATE FIELD-EFFECT TRANSISTOR DEVICE WITH IMPLANTED FIELD

[75] Inventor: William Eddie Armstrong, Tempe, Ariz.

[73] Assignee: Motorola, Inc., Franklin Park, Ill.

[22] Filed: Dec. 4, 1972

[21] Appl. No.: 312,013

[52] U.S. Cl. .................. 148/1.5, 148/33.3, 148/187, 357/91

[51] Int. Cl. .............................................. H01l 7/54

[58] Field of Search .................... 148/1.5, 33.3, 187; 317/235

[56] References Cited

UNITED STATES PATENTS

| | | | |
|---|---|---|---|
| 3,413,531 | 11/1968 | Leith | 148/1.5 X |
| 3,544,858 | 12/1970 | Kooi | 317/235 |
| 3,704,177 | 11/1972 | Beale | 148/1.5 |
| 3,730,778 | 5/1973 | Shannon et al. | 148/1.5 |
| 3,749,610 | 7/1973 | Swann et al. | 148/1.5 |
| 3,752,711 | 8/1973 | Kooi et al. | 148/33.3 |

*Primary Examiner*—L. Dewayne Rutledge
*Assistant Examiner*—J. M. Davis
*Attorney, Agent, or Firm*—Vincent J. Rauner; Willis E. Higgins

[57] ABSTRACT

A semi-planar insulated gate field effect transistor integrated circuit device having an ion implanted field region to achieve high field inversion voltage. The field effect transistor is fabricated on an elevated region of P-type silicon surrounded by and aligned to an implanted P-type field region. A thick field oxide layer on the implanted P-type field region surrounds and extends somewhat above the elevated region of P-type silicon in which the field effect transistor is fabricated. The field effect transistor includes N+ source and drain regions, a gate oxide insulator, a gate electrode and an interconnect metal layer provided in the elevated active region of P-type silicon.

The method of manufacturing includes thermally growing a high integrity oxide layer on the P-type substrate, depositing a layer of nitride thereon, and removing the nitride over the field region, thereby leaving nitride over the active region of the silicon. The surface of the device is bombarded with boron ions to produce an implanted layer in the field region, with the nitride serving as an implant mask. The boron ions are then redistributed by application of a heat cycle. A thermal oxidation step increases the thickness of the oxide over the field, causing a deeper implanted P-type field region to be formed. The surface concentration of the implanted field region is increased by a subsequent heat cycle to compensate for boron ions depleted at the oxide-silicon interface during the oxidation cycle. The oxide formed on the nitride is removed and the field effect transistor is provided in the active region in a conventional manner.

14 Claims, 18 Drawing Figures

METHOD OF MAKING A SEMI PLANAR INSULATED GATE FIELD-EFFECT TRANSISTOR DEVICE WITH IMPLANTED FIELD

BACKGROUND OF THE INVENTION

1. Field of the invention

The invention relates to MOS devices and methods for manufacturing MOS devices, particularly to MOS devices which have ion implanted field regions between MOS transistors to increase the field inversion voltage to eliminate parasitic channels which may otherwise occur under operating conditions.

2. Description of the prior art

A problem arises in the manufacture of semiconductor devices, including insulated gate field effect transistor circuits when substantial differences in level occur on the top surface of the device. Such differences in level frequently occur when oxide layers of substantially different thickness are formed and patterned by conventional techniques during the fabrication of the semiconductor devices. Such differences in level, which may be called "steps," appear in insulated gate field effect transistor integrated circuits because thin oxide layers are required over the channel region to obtain low threshold voltages, and because in the field region thick oxide layers are needed to prevent parasitic channels from occurring under operating conditions.

The large level differences between the active regions and the field regions of the semiconductor devices are not necessarily deleterious in themselves. The active region is the area in which insulated gate field effect transistors are formed, including the channel region and the source and drain regions, and also diffused cross-under regions. The remaining area on the semiconductor die surface is called the "field" region. However, the large steps which occur at the boundary between thin oxide layers and thick oxide layers leads to problems in the metallization. Where the evaporated metal crosses over such large steps, localized thinning of the metallization occurs which can only be avoided by such inconvenient expedients as using very thick metal, or by controlling the slope of the step between the two levels, or by multidirectional evaporation techniques. The thinning which occurs when metallization crosses over a step frequently causes low fabrication yield due to discontinuties in the metallization, and further frequently causes reduced reliability due to migration of metal under high-current operating conditions. In addition to the above-described metallization step coverage problems, there are also similar photo-resist step coverage problems for large magnitude steps. Such photo-resist step coverage problems may also cause reductions in manufacturing yield.

A number of techniques have been derived recently to achieve smaller steps in order to alleviate the previously described step coverage problems. Most of these techniques involve the use of a nitride layer to mask against thermal oxidation of the underlying silicon. The nitride layer is typically patterned to cover the active regions of the integrated circuit die, and the remaining area (i.e., the field region) is thermally oxidized by subjecting the wafer to high temperatures in the presence of oxygen. As the field oxide is thermally grown the underlying silicon is consumed, resulting in a structure in which the silicon surface in the active region is elevated above the surface of the remaining silicon in the field region. Thus, approximately the half of the thick field oxide layer extends below the level of the surface of the active region, and the other half extends above the level of the surface of the active region. Thus, a more planar surface is obtained than if the entire field oxide is deposited or grown on the original silicon surface, and patterned to define the active regions.

While the above-mentioned techniques do provide a more planar surface, thereby reducing metallization step coverage problems, they are of no help in reducing the problems caused by parasitic channel formation, and indeed tend to make such problems worse by depleting the surface concentration of the silicon in the field region during the thermal oxidation cycle.

Several disadvantages result when the nitride layer is deposited directly on the silicon in the active region. For example, during the subsequent thermal oxidation of the silicon in the field region a great deal of stress is developed in the nitride layer around its periphery, where the thermal oxide grows under the nitride lip and pushes it up. The stress can cause cracks in the nitride layer. Further, the nitride tends to damage the silicon surface so that thermal oxidation and stripping steps are required to remove the damaged silicon to provide a surface suitable for subsequent fabrication of field effect devices. Yet another disadvantage of a nitride layer deposited directly on the silicon is that the subsequently grown gate oxide layer tends to rupture around its periphery where it joins the earlier grown field oxide layer.

In another recent prior art process a layer of silicon dioxide is deposited on the silicon prior to deposition and patterning of the nitride layer. This reduces stress in the nitride layer due to pushing up by the thermal oxidation in the field region and avoids surface damage caused by deposition of nitride directly on silicon. However, it does not avoid the problems of low field inversion voltages and stresses between the field ooxide and the subsequently formed grown gate oxide.

The present invention solves the previously described shortcomings of the prior art by producing an insulated gate field effect integrated circuit wherein a high integrity thermal oxides are grown over the entire surface of the silicon wafers and a nitride layer is deposited thereon and patterned to mask the active regions against ion bombardment and subsequent thermal oxidation of the field regions.

SUMMARY OF THE INVENTION

An object of this invention is to provide an improved semiconductor device having increased magnitude field inversion voltages.

Another object of this invention is to provide a semiconductor device having improved step coverage of interconnect metallization wherein improved manufacturing yield and improved operating reliability are achieved.

Another object of this invention is to provide a semiconductor device of the type described having its field region implanted with impurity ions to increase the field inversion voltage.

Yet another object of the invention is to provide a semiconductor device of the type described wherein a thin, high integrity thermal oxide layer is provided beneath a masking nitride layer patterned to mask the active regions of the semiconductor device from ion bombardment and subsequent thermal oxidation.

It is another object of the invention to provide a semiconductor device of the type described wherein the implanted impurities are redistributed before and after the thermal oxidation of the field region to increase the magnitude of the field inversion voltage.

Still another object of the invention is to provide a semiconductor device of the type described wherein insulated gate field effect transistors are provided in the active regions.

Yet another object of the invention is to provide a semiconductor device of the type described wherein complementary insulated gate field effect transistors are provided in the active regions.

Yet another object of the invention is to provide a method of manufacturing semiconductor devices of the type described.

Briefly described, the invention is a semi-planar integrated circuit semiconductor device having an ion implanted field region to achieve high field inversion voltages. Elevated regions of the P-type silicon are provided which are surrounded by and aligned to an implanted P-type field region. A thick field oxide layer on the implanted P-type field region surrounds and extends above the elevated regions of P-type silicon. In one embodiment, an N-channel insulated gate field effect transistor is fabricated in each of a plurality of elevated regions of P-type silicon. In another embodiment, complementary insulated gate field effect transistors are provided in elevated regions of silicon, wherein the substrate is lightly doped N-type silicon, and P-channel insulated gate field effect transistors are fabricated in elevated N-type silicon regions, and N-channel insulated gate field effect transistors are fabricated in lightly doped P-type "tub" regions, which are provided within other elevated silicon regions.

The method of manufacturing the above-described semiconductor devices includes thermally growing a high integrity oxide layer on a silicon substrate, depositing a layer of silicon nitride on said oxide layer, and depositing another layer of silicon dioxide on the nitride layer. The top oxide layer and the nitride layer are then patterned using conventional photolighographic techniques to provide a patterned nitride mask over the active regions of the substrate, thereby defining the integrated circuit configuration. The working surface of the device is subsequently bombarded with boron ions to produce an implanted layer in the field region, the nitride layer serving as a mask. The boron ions are then redistributed by application of a heat cycle, and are then further redistributed during a thermal oxidation step which increases the thickness of the field oxide. A final heat cycle redistributes the boron ions to provide increased magnitude field inversion voltages. Insulated gate field effect devices may then be fabricated within the elevated active regions using conventional techniques. In one embodiment, a second boron implantation step is performed followed by redistribution heat cycle to provide lightly doped P-type "tubs." Complementary insulated gate field effect transistor circuits are then fabricated in the appropriate active regions.

DETAILED DESCRIPTION OF THE INVENTION

Figure 1:
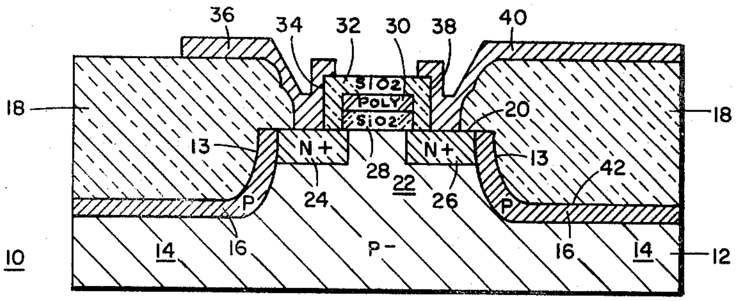
FIG. 1 is a cross sectional diagram of an embodiment of the invention.

FIG. 1 is a cross sectional diagram of an insulated gate field effect transistor (IGFET) integrated circuit device 10. The lightly-doped P-type body of silicon 12 has an elevated active region 13 and a surrounding field region 14. Field region 14 includes a P-type region 16, more heavily doped than the bulk of the body of silicon 12. A thick field oxide layer 18 is formed on the surface of region 16, and further slightly overlaps the top surface 20 of elevated region 13. An N-channel silicon gate IGFET 22 is fabricated within the surface 20 of elevated region 13, and includes heavily doped N+ source and drain regions 24 and 26, respectively, each contiguous with P-type region 16. IGFET 22 also includes gate insulator 28, which may be silicon dioxide, and gate electrode 30, which may be heavily doped N+ polycrystalline silicon. A silicon dioxide insulating layer 32 is formed over gate insulator 28 and gate electrode 30. Gate electrode 30 may be connected to other circuitry (not shown) on the semiconductor body either by means of a metal contact through an aperture in oxide insulator 32, or by a direct connection to an N+ region. Metal electrode 36 makes ohmic contact to source region 24 through aperture 34 in the silicon dioxide forming insulator 32 and the upper portion of field oxide 18. Similarly, metal electrode 40 makes ohmic contact to drain region 26 through aperture 38 in the silicon dioxide.

It should be appreciated by those skilled in the art that the cross sectional diagram shown in FIG. 1 is not indicative of the dimensions of the parts of an actual device. It should also be clear to those skilled in the art that IGFET 22 may be structured differently then indicated in FIG. 1; for example, the gate electrode may be metal, rather than polycrystalline silicon.

If the voltage applied to gate electrode 30 exceeds the threshold voltage of IGFET 22, the P- silicon substrate 12 at the oxide-silicon interface under gate insulator 28 is inverted, forming an N-type channel between source region 24 and drain region 26. The threshold voltage (with source-to-substrate bias equal to zero volts) is desirably between 1 volt and 2 volts, and is a well known function of the doping concentration of substrate 12, the dielectric constant of gate insulator 28, the thickness of gate insulator 28, and the work function between the polycrystalline silicon forming gate electrode 30 and the silicon dioxide forming gate insulator 28.

Drain electrode metallization 40, as shown in FIG. 1, extends to the right-hand edge of the cross sectional diagram. The field inversion voltage is a function of the doping concentration of P-type region 16 and the thickness and dielectric constant of the field oxide 18. If the voltage on metal layer 40 exceeds the field inversion voltage, a parasitic N-type channel will form along oxide-silicon interface surface 42, possibly causing leakage currents deleterious to circuit operation, especially in dynamic MOS circuits. The avalanche breakdown voltage of the PN junction formed between the P-type field region 16 and a source or drain region, such as drain 26, is determined by the acceptor impurity concentration of region 16. If P region 16 has the same impurity concentration as substrate 12, the field inversion voltage $V_{TOX}$ is decreased, and a breakdown voltage $V_{BD}$ is increased. Thus, it is seen that a direct tradeoff exists with respect to the doping in the field region at the oxide-silicon interface, between the breakdown voltage and the field inversion threshold voltage. This invention solves the previously described field inversion problems of the prior art by providing implanted P-type regions 16 in the manner illustrated in FIGS. 2–11.

Figure 2:
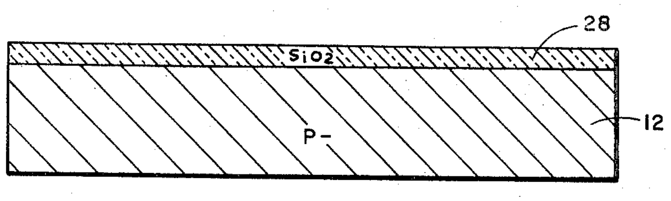
FIGS. 2–11 are cross sectional diagrams illustrating successive steps in the method of manufacturing the embodiment of the invention illustrated in FIG. 1.

According to the present invention, the first step in the formation of the device shown in FIG. 1 includes thermally growing a high integrity silicon dioxide layer 28 on the upper surface of lightly doped P-type substrate 12, as shown in FIG. 2. Part of $SiO_2$ layer 28 becomes the gate insulator in the finished device. The oxide thickness may, for example, be approximately 1,175 Angstroms units. As previously mentioned, both the IGFET transistor threshold voltage and the field inversion voltage depend on the resistivity of the substrate. For example, the substrate may be silicon with [100]crystal orientation and haaving a resistivity of 15 to 20 ohm-centimeters to provide devices suitable for operation from a 5 volt power supply. In this case, a second ion implanting step is performed (after final nitride removal) to provide a slightly increased surface impurity concentration in the channel region to increase the threshold voltage to the desired value. Or, to obtain a device which operates at higher speed, a substrate with [100]crystal orientation and having a resistivity of 7–9 ohm-centimeters may be used, wherein the substrate is reversed biased to increase threshold voltage to the 1 to 2 volt range during circuit operation and power supply voltages of greater than 10 volts are used.

Figure 3:
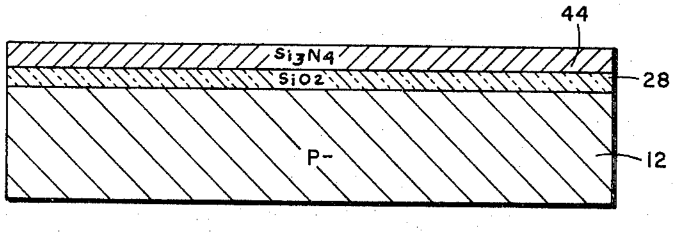
Figure 4:
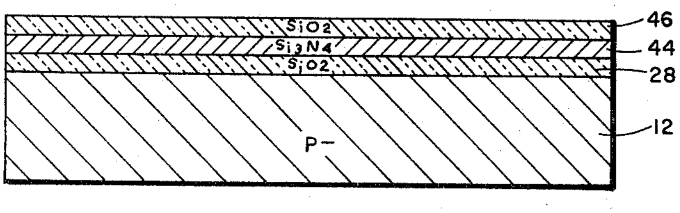

Referring to FIG. 3, a silicon nitride layer 44 is deposited on $SiO_2$ layer 28. The thickness of nitride layer 44 may, for example, be approximately 3,000 Angstroms. Referring next to FIG. 4, silicon dioxide layer 46 is deposited on nitride layer 44. Oxide layer 46 may, for example, be approximately 2,000 Angstroms thick.

Figure 5:
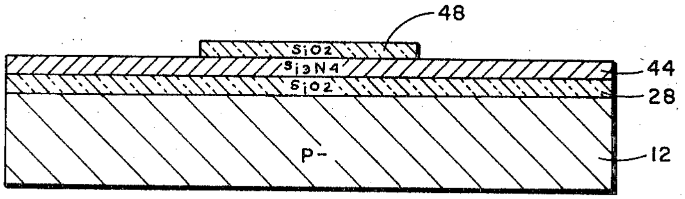
Figure 6:
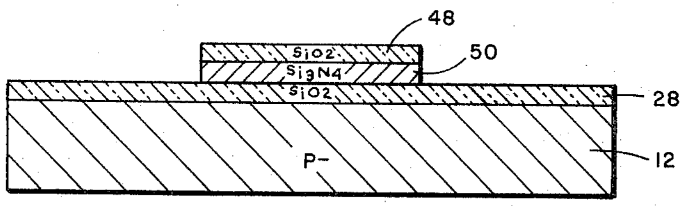

Silicon dioxide layer 46 is then patterned to define the active areas of the device beneath silicon dioxide layer 48, as shown in FIG. 5. The patterning is accomplished by conventional photolithographic techniques. For example, a 4:1 buffered HF etchant solution may be used to remove portions of layer 46, leaving the patterned portion 48. $SiO_2$ layer 48 serves as an etchant mask to protect silicon nitride layer 50, coextensive therewith, when the exposed portions of nitride layer 44 are removed. The etchant may be a refluxing phosphoric acid system in which the ratio of the etch rates of silicon nitride to silicon dioxide is approximately 100 to 1. This enables the exposed nitride to be completely etched away without significantly etching thin gate oxide layer 28. The structure at this point is shown in FIG. 6.

Figure 7:
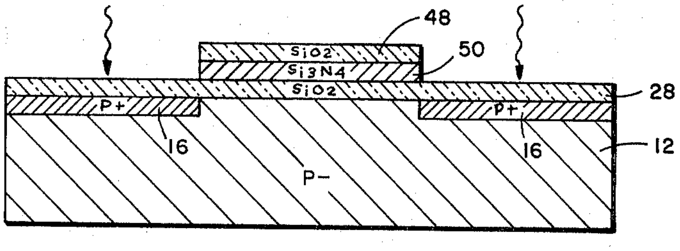

The upper surface of the device is then bombarded as indicated in FIG. 7 by high energy ions, which may be boron ions having energy of approximately 70 KEV. Silicon nitride layer 50 acts as a mask against the impinging boron ions, which penetrate thin oxide layer 28 to form P+ regions 16. The resulting density of boron atoms in regions 16 may be approximately $3 \times 10^{13}$ ions per square centimeter. At this point, the implanted regions 16 are very thin, being less than 2,000 Angstroms in thickness.

Figure 8:
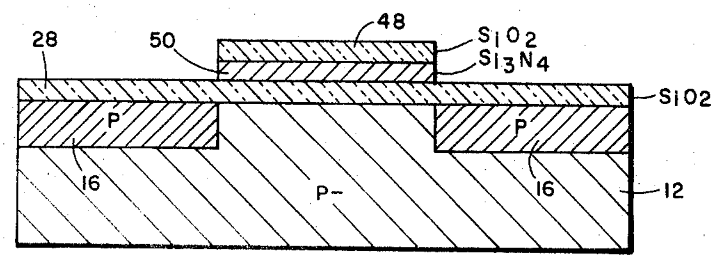

The wafer is then subjected to a heating cycle to redistribute (or drive-in) the implanted impurities resulting in the structure shown in FIG. 8, wherein regions 16 achieve deeper junction depths. The drive in cycle may, for example, include heating at 1050°centigrade in an argon ambient for 1 hour.

This is a very important step in the fabrication of devices having a high field inversion voltage. This is because the surface concentration in the implanted region 16 prior to the drive in cycle is approximately $10^{18}$ ions per cubic centimeter (for the above-suggested implant dose). Ninety percent of the ions are within the first 1,000 Angstroms. After the drive in cycle, the surface concentration is reduced to approximately $3 \times 10^{17}$ ions per cubic centimeter. Thus, the subsequent manufacturing step, which is a thermal oxidation of the field region, does not consume as much of the implanted ions during the first 2,000 Angstroms of oxide growth.

Figure 9:
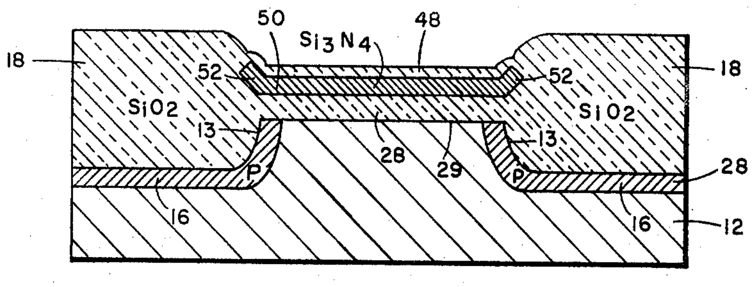

The wafer is then subjected to another heating cycle in the presence of steam, resulting in thermal oxidation of the silicon in the field region, resulting in the structure shown in FIG. 9. The thermal oxidation cycle may, for example, include heating the substrate to 1,050°C for 6 hours in steam, and may be continuous with the drive in cycle previously described, the argon ambient in the drive in cycle being replaced with steam, which causes thermal oxidation. During the oxidation cycle, the boron ions in region 16 are driven in further, and silicon at the oxide-silicon interface between the surface of regions 16 and oxide layer 28 is consumed, resulting in a thickening of the oxide over the field region to form field oxide 18, as shown in FIG. 9. As seen in FIG. 9, approximately half of the field oxide region 18 is at a level below the level of elevated silicon surface 29, and half is above, resulting in a smaller oxide step at the surface of the wafer then would be formed if the entire field oxide were above the level of surface 29.

Silicon nitride layer 50 masks the surface 29 of the active region of substrate 12 against thermal oxidation. During the oxidation cycle, the edges of nitride layer 50 are pushed up to form lips 52 thereon. As previously mentioned, the stress in the nitride layer 50 at the lips 52 is less than if the nitride layer 50 is deposited directly on the silicon surface 29. The consumption of silicon during the growth of the field oxide 18 results in elevated active region 13 being formed, as also shown in FIG. 9. The upper surface of nitride layer 50 undergoes some oxidation also. This oxidation is included in layer 48, which is drawn showing a reduced thickness in FIG. 9 compared to that of layer 48 in FIG. 8, for convenience.

After the thermal oxidation cycle is complete, the steam may be removed and argon substituted to produce further redistribution of the born ions in region 16. This is an important step in the present invention with respect to achieving high field inversion voltages, because prior to the final redistribution cycle the boron impurity concentration at the oxide-silicon interface is depleted as a result of the silicon-consuming thermal oxidation process. The boron ion concentration at the oxide-silicon interface (for the previously given concentration values) is approximately $0.4 \times 10^{16}$ ions per cubic centimeter while at a distance deeper into region 16 it is approximately $2 \times 10^{16}$ ions per cubic centimeter. The final redistribution cycle, which may include heating for 1 hour at 1,050°C in argon, raises the surface concentration at the oxide-silicon interface to approximately $2 \times 10^{16}$ atoms per cubic centimeter, substantially raising the field inversion voltage.

Figure 10:
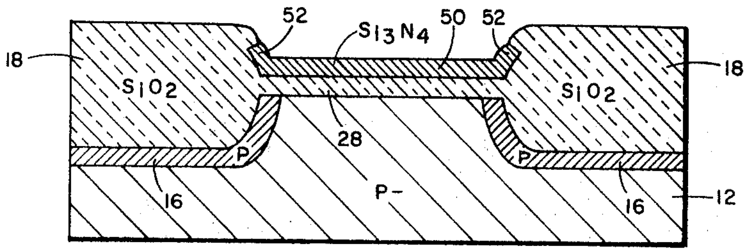

In the next step, the oxide layer 48 over nitride layer 50 is removed by a buffered HF etchant solution, resulting in the structure shown in FIG. 10. During this step the field oxide 18 is reduced somewhat in thickness, providing a reduced oxide step heighth. It should be recognized that oxide layer 48, just prior to its removal, includes a thin additional layer of oxide formed by conversion of the surface of nitride layer 50 to oxide during the thermal oxidation cycle in steam.

The final step prior to fabrication of transistors in the active regions is removal of silicon nitride layer 50 using phosphoric acid. This results in the structure shown in FIG. 11, wherein the high integrity gate oxide layer 28 is continuous with thick field oxide 18 without significant stress at the boundaries therebetween, which, as previously mentioned, may result in weakening at the periphery of the gate oxide and subsequent device failures.

Figure 12:
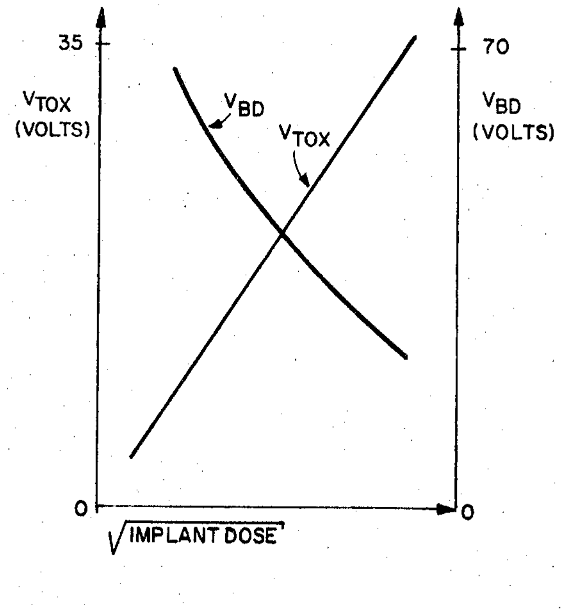
FIG. 12 is a graph useful in explaining the invention.

FIG. 12 is a graph showing field inversion voltage $V_{TOX}$ and diode reverse breakdown voltage $V_{BD}$ as a function of the initial ion implant dose. The graph illustrates the tradeoff between field inversion voltage and avalanche breakdown voltage of the PN+ diode shown in FIG. 1 between region 26 and region 16. $V_{TOX}$ increases as the implant dose increases, whereas the breakdown voltage $V_{BD}$ decreases. Further, the dynamic resistance of the PN+ junction in the breakdown region decreases, thereby providing improved protection of the associated gate oxide from rupture due to excessive voltages on the gate electrode caused by buildup of static charge. Using graphs such as the one shown in FIG. 12, the process can be optimized for particular power supply voltages.

It is emphasized that one of the main advantages of the invention is provision of a high integrity gate oxide under the nitride layer, rather than a deposited oxide which is subsequently removed prior to growth of high integrity gate oxide layers. It has been found that if the oxide under the nitride layer is stripped and a new gate oxide is grown over the IGFET channel region, stresses are generated in the new oxide around its periphery where it joins the field oxide, causing ruptures in the gate oxide. The method of the present invention avoids this problem by providing a high integrity oxide under the nitride suitable for use as a gate insulator.

It is also emphasized that the initial boron redistribution step prior to the thermal oxidation is crucial to the success of obtaining high field inversion voltages, because if the thermal oxidation commences without the prior redistribution of boron ions, most of the boron ions are consumed and become inactive within the thermal oxide, resulting in a very low surface concentration in the field region and subsequently in low field inversion voltages, since the thermal oxidation initially proceeds at a much faster rate than the redistribution of boron ions during the thermal oxidation.

Figure 11:
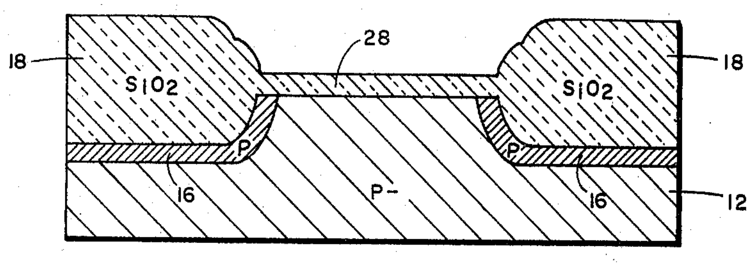

Insulated gate field effect transistors may now be formed in the active area of the structure shown in FIG. 11 to produce the final structure previously described and shown in FIG. 1. The IGFETs may be fabricated using conventional techniques. For example, polycrystalline silicon may be deposited over the entire wafer, and the polycrystalline layer and the gate oxide layer 28 may then be patterned using conventional techniques to obtain the layer 28 and 30 as shown in FIG. 1. Next, the surface of the device may be subjected to a phosphorous diffusion to provide a heavily doped N+ polycrystalline silicon gate electrode 30 and self-aligned N+ source and drain regions 24 and 26. After the N+ diffusion, an oxide layer is provided over the wafer, and preohmic holes are etched to allow contact to the source, drain and gate electrodes. Then another oxidation layer may be provided and smaller preohmic openings within the first preohmic openings may be provided, followed by evaporation and patterning of an interconnect metallization layer.

Figure 13:
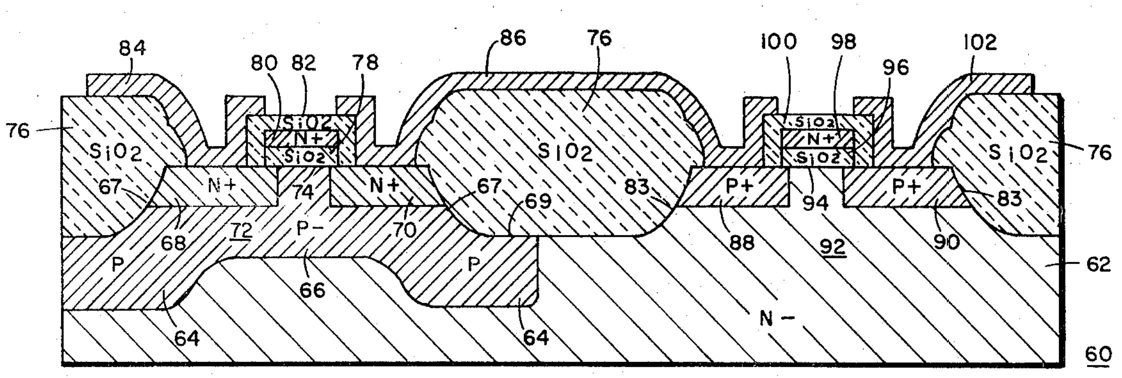
FIG. 13 is a cross sectional diagram of another embodiment of the invention.

The present invention can be applied to obtain complementary IGFET (also called CMOS) devices, such as the one shown in cross sectional drawing in FIG. 13. The complementary IGFET device is fabricated in a lightly doped N-type silicon substrate 62. As in the previously described embodiment, the IGFETs are fabricated within elevated active regions of silicon, designated by reference numerals 67 and 83, respectively, in FIG. 13. The field regions surrounding the active regions 67 and 83 have a thick field oxide 76 thereon which slightly overlaps the upper surfaces 74 and 94, respectively, of the elevated active areas 67 and 83, respectively. A lightly doped P-type "tub" 66 is provided in elevated active region 67, the tub 66 being continuous with more heavily doped P-type region 64, which extends outward under the field oxide 76. The P-type regions 64 have high field inversion voltage, which prevents parasitic channels from forming.

N-channel IGFET 72 is fabricated in tub 66, and includes heavily doped N-type source region 68 and drain region 70. The gate insulator is provided by silicon dioxide layer 78 and the gate electrode is heavily doped N-type polycrystalline silicon layer 80. Silicon dioxide layer 82 overlies gate electrode 80 and gate insulator 78. Metal electrode 84 provides ohmic contact to source region 68 through the opening in the oxide. Metal electrode 86 provides ohmic contact to drain region 70.

P-channel IGFET 92 is fabricated in elevated active region 83, and includes heavily doped P-type drain region 88 and source region 90. The corresponding gate insulator is formed by silicon dioxide layer 96 which has heavily doped N-type polycrystalline silicon gate electrode 98 thereon. Silicon dioxide layer 100 overlies gate electrode 98 and gate insulator 96. Metal electrode 86 provides ohmic contact to P-type drain electrode 88 through a preohmic opening in the oxide. Metal source electrode 102 provides ohmic contact to P+ source region 90 through the illustrated preohmic opening.

If gate electrodes 80 and 98 are connected together, and metal electrode 102 is connected to a positive power supply and metal electrode 84 is connected to ground potential, the complementary IGFET device shown in FIG. 13 becomes an inverter.

The device shown in FIG. 13 has many of the same advantages as previously described with reference to the device shown in FIG. 1. For example, the semiplanar surface reduces the size of the oxide steps thereby providing good metallization step coverage. The P-type regions 64 cause high field inversion voltage, which interrupt parasitic channels which could otherwise form, for example, between substrates 62 and N-type drain region 70 along the oxide-silicon interface 69 when metal electrode 86 is at a high potential. The method of manufacturing the device, as described hereinafter, provides devices of high reliability by producing a high integrity gate oxide which is relatively free of peripheral stress points. Further, very stable complementary IGFET devices are achieved by providing heavily phosphorus-doped silicon gate electrodes for both the P-channel and N-channel IGFETs.

Figure 14:
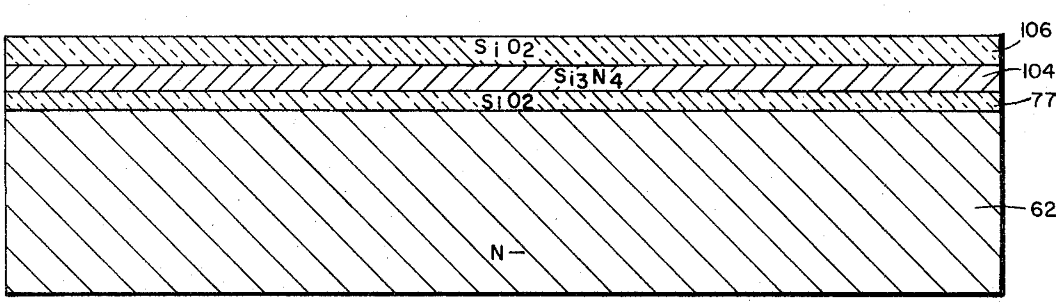
FIGS. 14–18 are cross sectional diagrams illustrating the method of manufacturing the embodiment shown in FIG. 13.

To manufacture a device as described with reference to FIG. 13 in accordance with this invention, a thin, high integrity gate oxide layer 77 is thermally grown on lightly doped N-type silicon substrate 62. Referring to FIG. 14, silicon nitride layer 104 is subsequently deposited on silicon dioxide layer 77, and then a second silicon dioxide layer 106 is deposited on nitride layer 104. Layers 77, 104 and 106 may advantageously be formed in the same reactor. The thicknesses of layers 77, 104 and 106 and the resistivity of substrate 62 may, for example, be the same as those correspondingly described in relation to the embodiment of FIG. 1.

Figure 15:
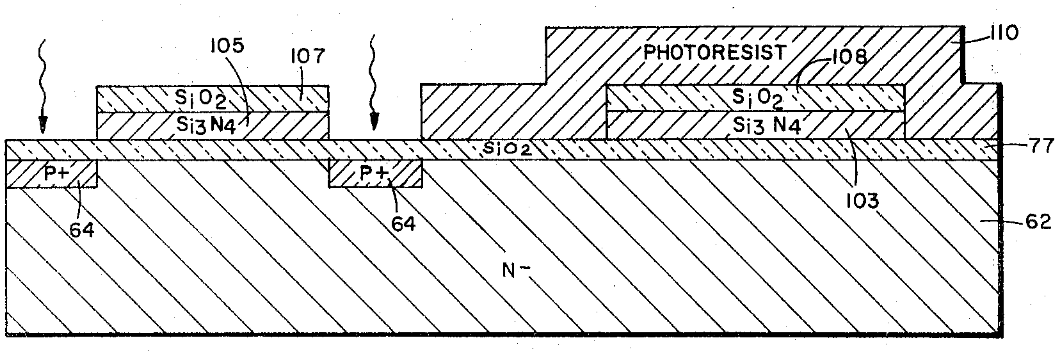

Referring now to FIG. 15, oxide layer 106 and nitride layer 104 are patterned, using conventional techniques, to define the active areas for the complementary IGFET devices, so that silicon nitride layer 105 and silicon dioxide layer 107 define the active region for the N-channel device 72 and nitride layer 103 and oxide layer 108 define the active area for the P-channel IGFET 92. Photoresist layer 110 is provided on the wafer and patterned to define P-type tub region 66 and P-type region 64 (FIG. 1). Photoresist layer 110 acts as a mask against ion implanation, as does silicon nitride layer 105, so that when high energy boron ions bombard the surface of the wafer, heavily doped P+ regions 64 are formed as shown in FIG. 15.

Figure 16:
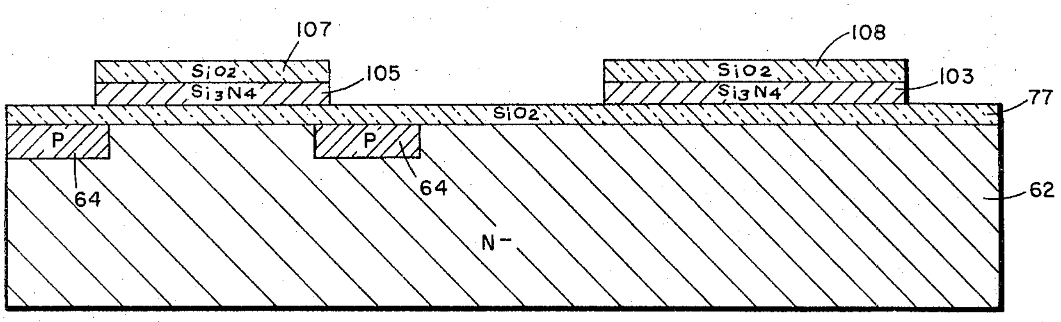

The next step is application of a heating cycle to redistribute the boron ions in region 64, after the removal of photoresist layer 110, resulting in the structure shown in FIG. 16, wherein P region 64 has a deeper junction depth. The drive-in heat cycle may, for example, be the same as previously described with reference to FIG. 8.

Figure 17:
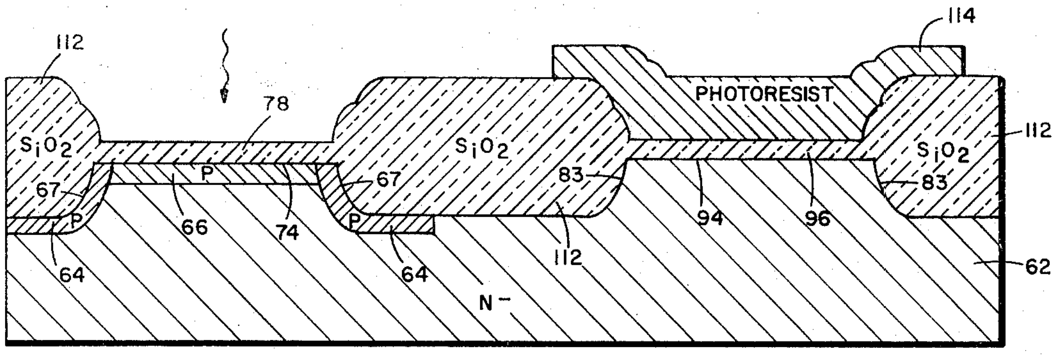

Next, a thermal oxidation cycle, which may be the same as previously described with reference to FIG. 9, is applied to the device to form a thick field oxide 112 over the entire field region, as shown in FIG. 17. During the thermal oxidation cycle, silicon is consumed at the oxide-silicon interface in the field region as previously described, producing elevated active regions 67 and 83. Redistribution of the boron ions in region 64 continues during the thermal oxidation, since the initial redistribution cycle prevents the majority of the boron ions from being consumed during the first stages of the thermal oxidation cycle.

Still referring to FIG. 17, the next step is to remove the oxide regions 107 and 108 over the nitride layers 105 and 103, respectively. Then, using, for example, a phosphoric acid etchant, nitride layers 105 and 103 are removed. Then a photoresist layer 114 is provided to protect elevated active region 83. Then the surface of the wafer is subjected to bombardment by high energy boron ions, which penetrate thin gate oxide layer 78 to form heavily doped P-type layer 66 within the surface 74 of elevated active region 67. The thick field oxide 112 and photoresist layer 114 mask the rest of the wafer from implantation of boron ions in the silicon.

Figure 18:
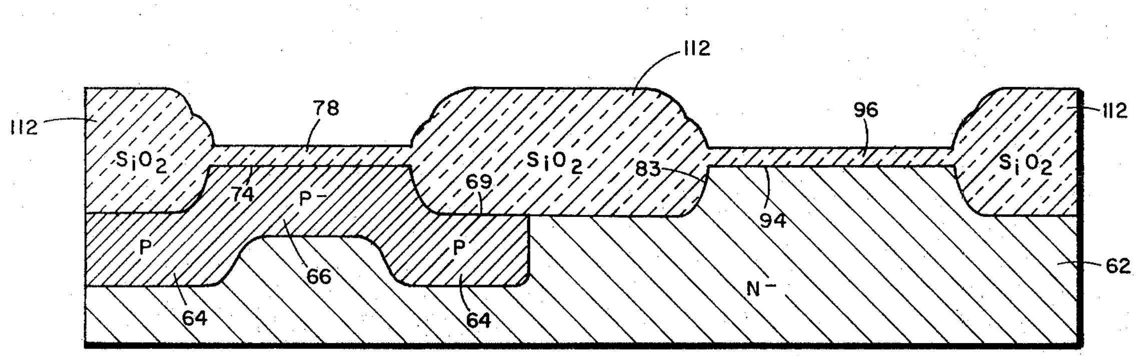

Referring to FIG. 18, after removal of the photoresist layer 114, the wafer is subjected to a second drive-in cycle in which the boron ions in regions 64 and in implanted layer 66 are further redistributed to form lightly doped P- tub region 66, and also to raise the surface concentration in the field region at the oxide-silicon interface surface 69 between P-type region 64 and field oxide 112. The resulting structure, as shown in FIG. 18, provides a lightly doped P-type tub in which the N-channel IGFET devices may be subsequently fabricated, as shown in FIG. 13. As described in relation to the previous embodiment of the invention, the field inversion voltage at the oxide-silicon interface 69 is increased by the final drive-in cycle, which may be the same as described previously in relation to FIG. 9. Referring to FIG. 13, it should be clear that an N-type layer more heavily doped than substrate 62 could be provided to extend for a distance beneath field oxide layer 76 to provide increased field invention voltage with respect to the N-type susbstrate 62, at the cost of introducing complexities into the manufacturing process.

In summary, the invention provides a semi-planar field implanted insulated gate field effect transistor integrated circuit structure which provides the advantages of small oxide steps (with associated improvements in manufacturability and reduced diffusion spacings), high field inversion voltage, high integrity gate oxides free from peripheral weak spots, and improved protection from gate over-voltages caused by static electrically, etc.

Although this invention has been illustrated and described in relation to several specific embodiments thereof, those skilled in the art will readily recognize that variations in placement of parts and in order of manufacturing steps may be made to suit specific requirements without departing from the spirit and scope of the invention.

What is claimed is:

1. A method for treating a semiconductor body for forming a device region within said body suitable for manufacturing at least one MOS structure therewithin including a gate oxide element, and for forming a field region surrounding said device region having a high field inversion voltage characteristic comprising the steps of:

providing a body of semiconductor material of one tyep conductivity and said body having an upper surface;

forming a first oxide layer on said upper surface of said body of semiconductor material, and said layer is formed by thermal oxidation resulting in the formation of a layer suitable for use as the gate oxide element of the MOS structure;

depositing a first making layer on said first oxide layer, and said layer is suitable for use both as a mask against implanting ions into said body of semiconductor material and for use as a mask against thermal oxidation of the underlying portion of the upper surface of said body of semiconductor material;

forming a second oxide layer on said first masking layer;

patterning said second oxide layer for retaining a portion of said second oxide layer overlying a corresponding portion of said intervening masking layer and overlying a corresponding portion of said first oxide layer suitable as the gate element and also overlying the device portion of said upper surface of said semiconductor body in which the MOS structure is to be formed, and said patterning also being operative for exposing the remaining portions of said masking layer;

etchably removing said exposed portion of said first masking layer for exposing the underlying portions of said first oxide layer;

implanting impurity ions of said one conductivity type through said exposed portion of said first oxide layer into said body of semiconductor material to form an implanted field region under said exposed portion of said first oxide layer, and said impurity ions forming a field region of said one type conductivity and said field region being positioned to surround a portion of said semiconductor body;

heating said resulting body of semiconductor material in an inert atmosphere for redistributing said impurity ions deeper into said body;

further heating said body of semiconductor material in an oxidizing atmosphere for oxidizing the upper surface of said body underlying the exposed portion of said first oxide layer resulting in such an increase in the thickness of said exposed oxide layer as to be suitable as a field oxide layer over said upper surface of said body of semiconductor material not masked by said masking layer whereby, the masked portion of said first oxide layer is suitable for use as the gate oxide element of the MOS structure and the implanted field region increases the field surface inversion voltage characteristic of the semiconductor structure and the field oxide layer provides a more even surface for the resulting semiconductor body.

2. The method for manufacturing a semiconductor device as recited in claim 1 including the step of further heating the substrate in an inert atmosphere at a temperature to further redistribute the implanted impurity ions such as to increase the concentration thereof at the oxide-semiconductor interface between said field oxide layer and said body of semiconductor material for increasing the field inversion voltage.

3. The method for manufacturing a semiconductor device as recited in claim 2 including the steps of removing said second oxide layer and said first masking layer.

4. The method for manufacturing a semiconductor device as recited in claim 1 wherein said first conductivity type is P-type and said impurity ions are boron.

5. The method for manufacturing a semiconductor device as recited in claim 1 wherein said body of semiconductor material is silicon, said first oxide layer is thermally grown high integrity silicon dioxide, and said first masking layer is silicon nitride.

6. The method for manufacturing a semiconductor device as recited in claim 2 further including the step of implanting a second quantity of ions into said active region through said first oxide layer after the removal of the remaining part of said first masking layer to control the threshold voltage of subsequently fabricated field effect devices.

7. A method for treating a semiconductor body for forming a plurality of device regions within said body suitable for manufacturing at least one MOS structure within each region including a gate oxide element, and for forming a field region surrounding said device regions having a high field inversion voltage characteristic for preventing surface channeling between devices, comprising the steps of:

providing a body of semiconductor material of one type conductivity and said body having an upper surface;

forming a first oxide layer on said upper surface of said body of semiconductor material, and said layer is formed by thermal oxidation resulting in the formation of a layer suitable for use as the gate oxide element of the MOS structure;

depositing a first masking layer on said first oxide layer, and said layer is suitable for use both as a mask against implanting ions into said body of semiconductor material and for use as a mask against thermal oxidation of the underlying portions of the upper surface of said body of semiconductor material;

forming a second oxide layer on said first masking layer;

patterning said second oxide layer for retaining a plurality of portions of said second oxide layer overlying first and second corresponding portions of said intervening masking layer and overlying first and second corresponding portions of said first oxide layer suitable as the gate element of the MOS devices and also overlying first and second device portions of said upper surface of said semiconductor body in which the MOS structure is to be formed, and said patterning also being operative for exposing the remaining portions of said masking layer;

etchably removing selected portions of said first masking layer for exposing the underlying portions of said first oxide layer, and a first one of said portions of said first oxide layer being associated with said first device region and a second one of said portions of said first oxide layer being associated with said second device region and said etching also being operative for retaining said first and second portions of said masking layer being in encircling relationship with said exposed, corresponding portions of said first oxide layer;

providing an ion implant mask for at least one of said exposed portions of said first oxide layer surrounding said second portion of said masking layer;

implanting impurity ions through said remaining exposed portion of said first oxide layer into said body of semiconductor material to form an implanted field region of a second conductivity type under said exposed portion of said first oxide layer, and said impurity ions forming a field region of said second conductivity type, and said field region being positioned to surround a portion of said semiconductor body;

heating said rsulting body of semiconductor material in an inert atmosphere for redistributing said impurity ions deeper into said body;

further heating said body of semiconductor material in an oxidizing atmosphere for oxidizing the upper surface of said body underlying said exposed portions of said first oxide layer, which are exposed during said etching step, resulting in an increase in the thickness of said exposed oxide layer and the formation of a field oxide layer over said upper surface of said body of semiconductor material not masked by said masking layer; and removing said remaining portion of said second oxide layer and said first masking layer and said ion implant mask whereby, the masked portion of said first oxide layer is suitable for use as the gate oxide element of the MOS structure and the implanted field region increases the field surface inversion voltage characteristic of the semiconductor structure and the field oxide layer provides a more even surface for the resulting semiconductor body.

8. The method for manufacturing a semiconductor device as recited in claim 7 further including the step of providing a third masking layer on said first oxide layer overlying said second active region, said third masking layer acting to prevent ions from being implanted in said second active region.

9. The method for manufacturing a semiconductor device as recited in claim 8 further including the step of implanting a second quantity of ions of the second conductivity type through said first oxide layer into said first active region.

10. The method for manufacturing a semiconductor device as recited in claim 9 further including the step of:

removing said third masking layer; and heating said body of semiconductor material in an inert atmosphere to redistribute said second quantity of ions to form a lightly doped "tub" region of said second conductivity type in said first active region and to further redistribute said first quantity of ions to increase the concentration thereof at the oxide-semiconductor interface between said field oxide layer and said body of semiconductor material, thereby increasing the field inversion voltage.

11. The method for manufacturing a semiconductor device as recited in claim 10 wherein:

said body of semiconductor material is silicon;

said first oxide layer is thermally grown silicon dioxide;

said first masking layer is silicon nitride;

said second masking layer is photoresist;

said third masking layer is photoresist;

said first conductivity type is N-type; and said first and second quantities of ions are boron.

12. The method for manufacturing a semiconductor device as recited in claim 11 wherein an N-channel insulated gate field effect transistor is fabricated in said first active region and a P-channel insulated gate field effect transistor is fabricated in said second active region.

13. The method for manufacturing a semiconductor device as recited in claim 12 wherein said insulated gate field effect transistors have phosphorous doped polycrystalline silicon gate electrodes.

14. The method for manufacturing a semiconductor device as recited in claim 12 wherein said insulated gate field effect transistors have metal gate electrodes.

* * * * *